United States Patent
Behera et al.

(10) Patent No.: US 7,415,641 B1
(45) Date of Patent: Aug. 19, 2008

(54) SYSTEM AND METHOD FOR REPAIRING A MEMORY

(75) Inventors: Niranjan Behera, Fremont, CA (US); Bruce L. Prickett, Jr., Fremont, CA (US); Yervant Zorian, Santa Clara, CA (US)

(73) Assignee: Virage Logic Corp., Fremont, CA (US)

( * ) Notice: Subject to any disclaimer, the term of this patent is extended or adjusted under 35 U.S.C. 154(b) by 593 days.

(21) Appl. No.: 10/702,014

(22) Filed: Nov. 5, 2003

(51) Int. Cl.
*G06F 11/00* (2006.01)
*G11C 7/00* (2006.01)

(52) U.S. Cl. .................................... 714/711; 365/201

(58) Field of Classification Search ............... 714/710, 714/711, 719
See application file for complete search history.

(56) References Cited

U.S. PATENT DOCUMENTS

| | | | | |
|---|---|---|---|---|
| 5,555,522 A * | 9/1996 | Anami et al. | ................ | 365/200 |
| 5,701,270 A * | 12/1997 | Mohan Rao | ........... | 365/230.03 |
| 6,023,434 A * | 2/2000 | Shore et al. | .................. | 365/201 |
| 6,396,760 B1 | 5/2002 | Behera et al. | | |
| 6,519,202 B1 | 2/2003 | Shubat et al. | | |
| 6,553,510 B1 * | 4/2003 | Pekny | ............................ | 714/6 |
| 6,567,323 B2 * | 5/2003 | Pitts et al. | .................... | 365/200 |
| 6,735,727 B1 * | 5/2004 | Lee | ............................. | 714/711 |
| 6,745,354 B2 * | 6/2004 | Terzioglu | ..................... | 714/710 |
| 6,862,230 B2 * | 3/2005 | Winograd et al. | ........... | 365/200 |
| 6,870,782 B2 * | 3/2005 | Wu et al. | ..................... | 365/201 |
| 7,064,990 B1 * | 6/2006 | Dawson et al. | .............. | 365/200 |
| 7,230,872 B2 * | 6/2007 | Winograd et al. | ...... | 365/230.03 |
| 2001/0016893 A1 * | 8/2001 | Merritt | .......................... | 711/1 |
| 2001/0056557 A1 * | 12/2001 | Kawagoe et al. | ............ | 714/723 |

FOREIGN PATENT DOCUMENTS

JP 2003178593 A * 6/2003

OTHER PUBLICATIONS

"Increased throughput for the testing and repair of RAMs with redundancy" by Haddad et al. Transactions on Computers Publication Date: Feb. 1991 vol. 40, Issue: 2 On pp. 154-166 ISSN: 0018-9340 INSPEC Accession No. 3911618.*

"Built in self repair for embedded high density SRAM" by Ilyoung et al. Test Conference, 1998. Proceedings., International Publication Date: Oct. 18-23, 1998 On pp. 1112-1119 ISSN: 1089-3539 INSPEC Accession No. 6265643.*

* cited by examiner

*Primary Examiner*—Cynthia Britt
(74) *Attorney, Agent, or Firm*—Danamraj & Emanuelson, P.C.

(57) ABSTRACT

A method and system for repairing a memory. A test and repair wrapper is operable to be integrated with input/output (I/O) circuitry of a memory instance to form a wrapper I/O (WIO) block that is operable to receive test and repair information from a built-in self-test and repair (BISTR) processor. Logic circuitry associated with the WIO block is operable generate a current error signal that is used locally by the BISTR processor for providing a repair enable control signal in order to repair a faulty memory portion using a redundant memory portion without having to access a post-processing environment for repair signature generation.

14 Claims, 12 Drawing Sheets

SYSTEM AND METHOD FOR REPAIRING A MEMORY

CROSS-REFERENCE TO RELATED APPLICATION(S)

This application discloses subject matter related to the subject matter disclosed in the following commonly owned co-pending patent application s): "System And Method For Testing A Memory," filed Nov. 5, 2003, application Ser. No. 10/701,545, in the name(s) of Niranjan Behera and Bruce L. Prickett, Jr., which is (are) hereby incorporated by reference for all purposes.

BACKGROUND OF THE INVENTION

1. Technical Field of the Invention

The present invention relates generally to semiconductor memories. More particularly, and not by way of any limitation, the present invention is directed to a system and method for repairing a memory instance.

2. Description of Related Art

Typically, memories are tested and repaired by serially transmitting commands from a built-in self-test (BIST) interface that is clocked with a test clock and then allowing the memory to perform a read or write operation. A processor, called a BIST processor, is usually provided for effectuating the testing operations. When several memory instances are interfaced with a single BIST processor, the serial command transfer process is slow and significantly limited by the delays inherent in the long signal paths necessitated by design and layout constraints. Accordingly, the memory testing operations are executed at a slower frequency than the clock frequency associated with the memory. Additionally, the BIST processor has to take a finite number of test clock cycles for each operation in order to send all commands serially, thereby substantially impacting the testing performance.

Furthermore, the conventional BIST processor arrangement is also fraught with several shortcomings and drawbacks with respect to memory repair. For instance, after the BIST processor completes the test algorithm, the failure data is scanned out by the BIST processor and provided to an external tester with additional intelligence. The failure data, which contains location information such as faulty row or faulty column address information, is post-processed by the tester software to create a repair bit signature that is fed back to the BIST processor. It should be appreciated that the whole process of repair bit generation takes several BIST clock cycles, not to mention the requirement of external tester intelligence to post-process the failure data for creating the requisite repair signature based on the memory array size, column MUX options, and the like. If the memory device has more errors than the repair elements, then the external tester needs additional intelligence to determine fatal errors, which can be time-consuming and cumbersome.

SUMMARY OF THE INVENTION

The present invention provides a scheme for repairing a memory. A test and repair wrapper is operable to be integrated with input/output (I/O) circuitry of a memory instance to form a wrapper I/O (WIO) block that is operable to receive test and repair information from a built-in self-test and repair (BISTR) processor. Logic circuitry associated with the WIO block is operable generate a current error signal that is used locally by the BISTR processor for providing a repair enable control signal in order to repair a faulty memory portion using a redundant memory portion without having to access a post-processing environment for repair signature generation.

In one aspect, the present invention is directed to a method of repairing a memory instance having a plurality (N) of main array column (MAC) portions and a redundancy array column (RAC) portion, wherein each of the MAC portions and the RAC portion is associated with a sense amplifier and write driver (SAWD) circuit block for operably coupling with one of N input/output (I/O) blocks provided for the memory instance. The method is comprised of: detecting that one of the MAC portions is faulty; decoupling the faulty MAC portion's SAWD circuit block from an I/O block associated therewith and thereby shifting the coupling relationship of the faulty MAC portion's I/O block to a SAWD circuit block associated with a MAC portion immediately next to the faulty MAC portion on a selected side thereof; and successively shifting the coupling relationships between SAWD circuit blocks and I/O blocks for each MAC portion disposed on the selected side of the faulty MAC portion until the coupling relationship of an I/O block associated with a MAC portion that is immediately next to the RAC portion is shifted to the RAC portion's SAWD circuit.

In another aspect, the present invention is directed to a system for repairing a memory instance having a plurality (N) of MAC portions and a RAC portion, wherein each of the MAC portions and the RAC portion is associated with an SAWD circuit block for operably coupling with one of the I/O blocks provided for the memory instance. The system comprises: circuitry for detecting that one of the MAC portions is faulty; circuitry for decoupling the faulty MAC portion's SAWD circuit block from an I/O block associated therewith and for shifting the coupling relationship of the faulty MAC portion's I/O block to a SAWD circuit block associated with a MAC portion immediately next to the faulty MAC portion on a selected side thereof; and circuitry for successively shifting coupling relationships between SAWD circuit blocks and I/O blocks for each MAC portion disposed on the selected side of the faulty MAC portion until the coupling relationship of an I/O block associated with a MAC portion that is immediately next to the RAC portion is shifted to the RAC portion's SAWD circuit.

In a still further aspect, the present invention is directed to a memory compiler for compiling at least one self-test and repair (STAR) memory instance, comprising: a code portion for generating a built-in self-test and repair (BISTR) processor associated with one or more STAR memory instances; and a code portion for generating a test and repair wrapper operable to be integrated with the I/O circuitry of the each of the STAR memory instances to form a wrapper I/O (WIO) block, wherein the WIO block includes circuitry to generate a current error signal that is used locally by the BISTR processor for providing a repair enable control signal in order to repair a faulty memory portion using a redundant memory portion provided with respect to the STAR memory instance.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
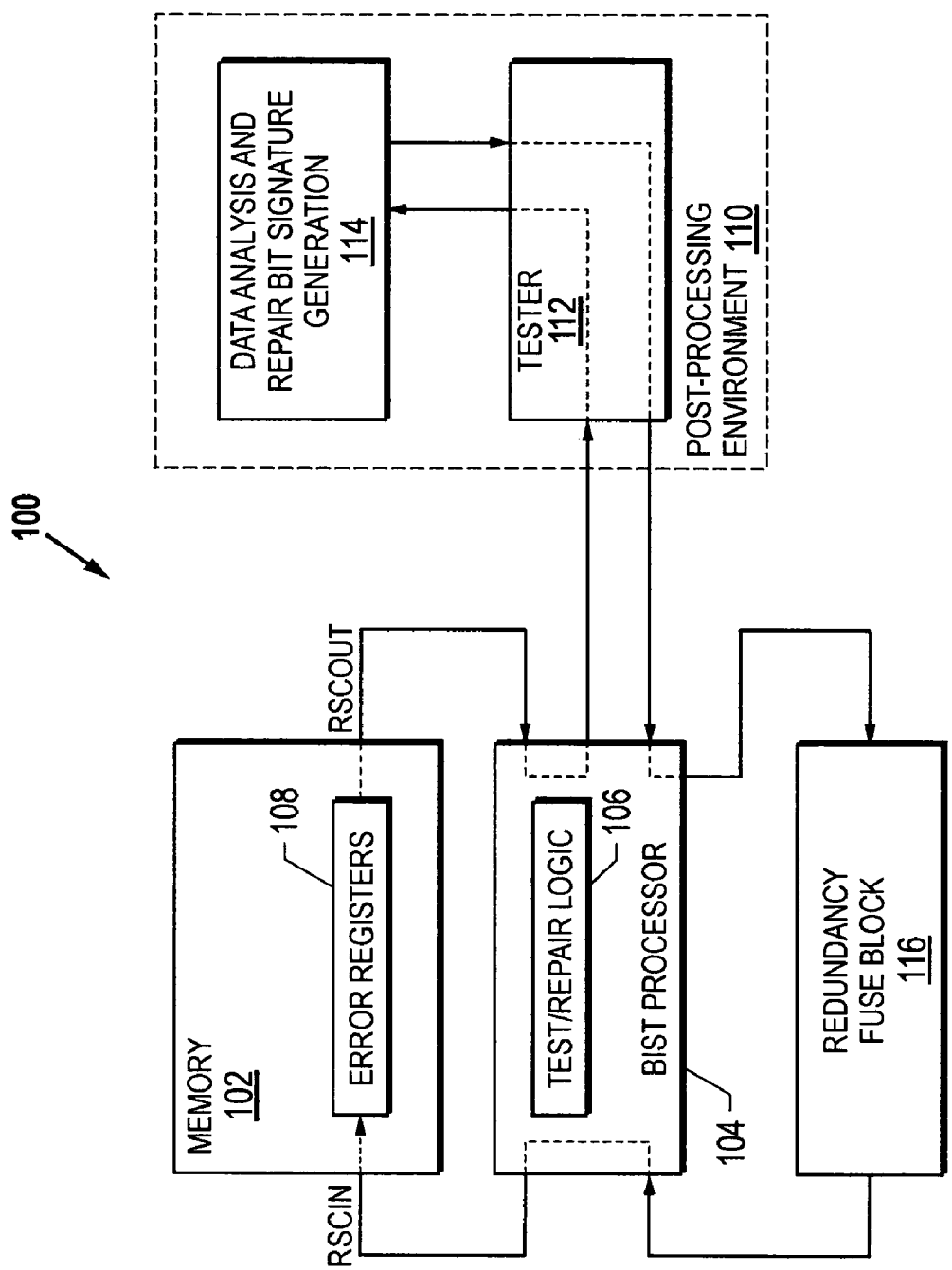
FIG. 1 (Prior Art) depicts an exemplary embodiment of a conventional memory repair system wherein an external post-processing environment is employed for generating a repair signature.

In the drawings, like or similar elements are designated with identical reference numerals throughout the several views thereof, and the various elements depicted are not necessarily drawn to scale. Referring now to FIG. 1, depicted therein is an exemplary embodiment of a conventional memory repair system 100 wherein an external post-processing environment 110 is employed for generating a repair signature that may be used for repairing a memory 102. As is well-known in the semiconductor memory art, an error register block 108 is provided in the path of a redundancy scan chain that is driven by a built-in self-test (BIST) processor 104 associated with the memory 102. The BIST processor 104 includes appropriate test and repair logic 106 that generates necessary testing signals (i.e., commands, data, and address signals) with respect to testing the memory 102 in accordance with a test algorithm. After completion of the testing process, the failure data captured in the error register block 108 is scanned out (as RSCOUT) by the BIST processor 104 for generating a repair signature used in repairing the failed memory locations by replacing with available redundant portions. Since the BISTR processor 104 is typically not capable of processing the RSCOUT information, which can include row failure addresses, column failure addresses, etc., an external tester 112 supported in the post-processing environment 110 is provided for effectuating repair bit signature generation. Ultimately, the external tester 112 may operate in association with additional processing functionality 114 of the post-processing environment 110 that includes logic for data analysis and repair bit signature generation. Upon completion of post-processing of the failure data, a repair bit signature is generated that is fed back to the BIST processor 104 for loading into a redundancy fuse block 116. The repair signature information is then scanned into the memory error register block 108 as RSCIN. As alluded to in the Background section of the present patent application, the whole process of providing appropriate repair signature information to the memory device 102 not only takes several test clock cycles, but additional tester intelligence is also needed for post-processing.

Figure 2:
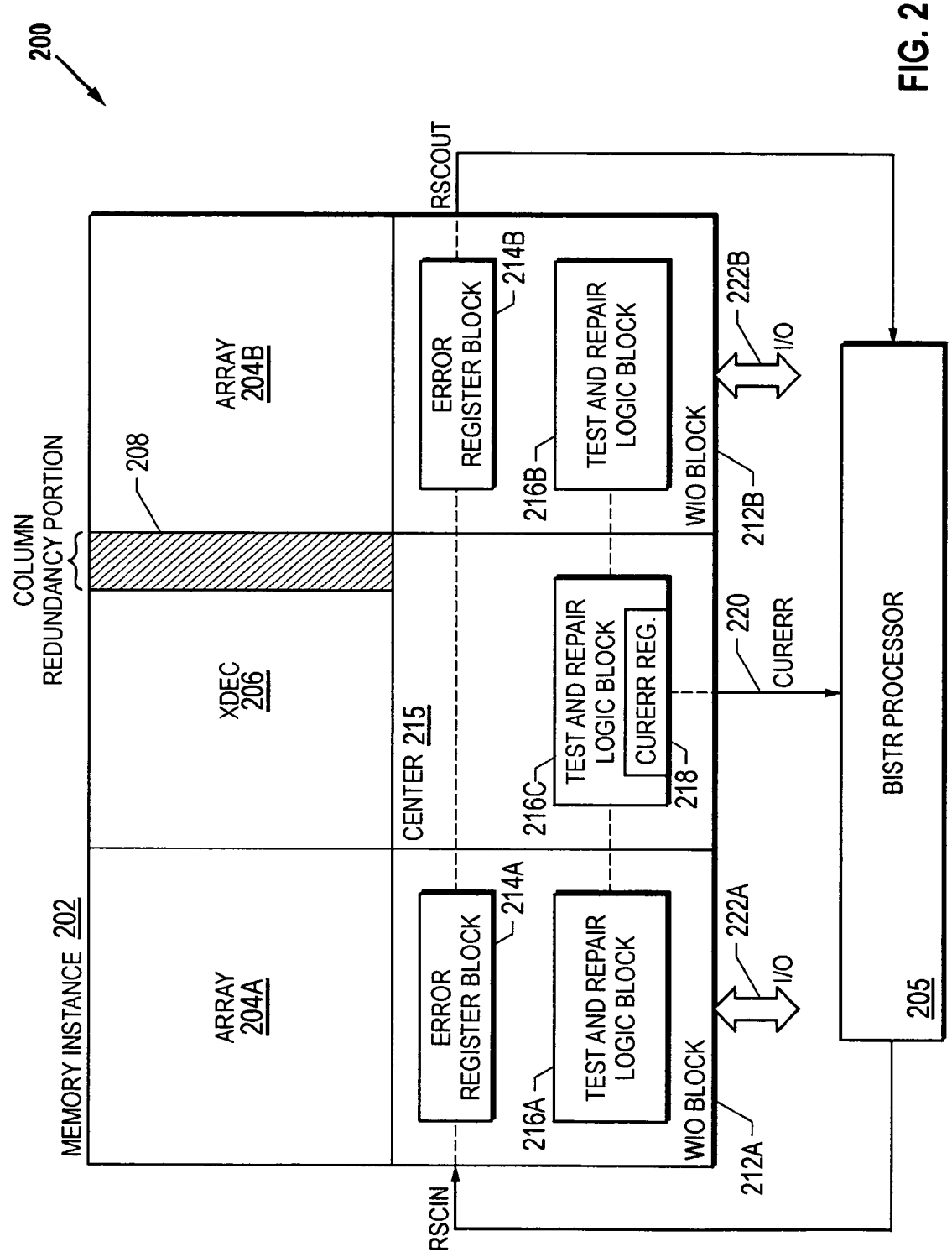
FIG. 2 depicts an exemplary embodiment of a memory instance wherein an integrated test repair logic (TRL) wrapper is advantageously employed for effectuating memory repair in accordance with the teachings of the present invention.

FIG. 2 depicts an exemplary embodiment of a memory repair system 200 of the present invention wherein an integrated test repair logic (TRL) wrapper is advantageously employed for effectuating repair in a memory instance 202 in accordance with the teachings set forth herein. It should be realized that the repair system 200 is shown having only one memory instance 202 for the sake of simplicity. As explained in the commonly owned co-pending U.S. patent application entitled "System And Method For Testing A Memory," filed Nov. 5, 2003 Application Ser. No.: 10/701,545, cross-referenced hereinabove, the memory instance 202 includes an integrated TRL wrapper that is operable to receive test/repair information scanned in from a BISTR processor 205 associated therewith for purposes of generating appropriate test signals internally. For instance, logic circuitry associated with the test and repair wrapper is operable to generate internal address, data and command signals based on the scanned test information, wherein the signals are used for effectuating various tests at speed with respect to the memory instance 202. In one exemplary embodiment, the tests may include, for instance, single cycle write operations; single cycle read operations; same cycle, simultaneous read/write operations; back-to-back write operations; back-to-back write followed by read operations; back-to-back read operations; back-to-back read followed by write operations, and the like. Moreover, logic circuitry relating to data comparison and error capture is also provided as part of the integrated TRL wrapper for capturing and reporting error information to the BISTR processor 205 for generating repair signatures. As will be seen below, the error information supplied by the TRL wrapper can be processed by the BISTR processor 205 without having to resort to external post-processing, thereby advantageously overcoming the various shortcomings and deficiencies of the state-of-the-art memory repair schemes.

With particular reference to the memory repair system 200 of FIG. 2, the TRL wrapper functionality is integrated within the input/output (I/O) block of the memory instance 202, thereby resulting into what may be referred to as "wrapper I/O" or "WIO" of the memory instance 202. By way of implementation, the memory instance 202 may be comprised of any known or heretofore unknown architecture and technology, and includes primary or main array portions 204A, 204B and a column redundant portion 208 in any manner or configuration. Accordingly, the memory instance 202 may be selected from the group including static random access memory (SRAM) instances, dynamic RAM (DRAM) instances, electrically programmable read-only memory (EPROM) instances, Flash memory instances, dual-port register file (RF) memory instances, and the like.

In the exemplary embodiment depicted, the memory instance 202 includes a centrally-placed row decoder block (XDEC) 206 between main array portions 204A and 204B such that the column redundancy portion 208 is disposed next to it. Associated with each main array portion of the memory instance 202 is a corresponding integrated WIO portion for facilitating I/O operations (via I/O signals 222A or 222B) as well as test and repair functionality. Accordingly, reference numeral 212A refers to the WIO block portion associated with array portion 204A, the WIO block portion 212A including corresponding error register block 214A and test/repair logic block 216A. Likewise, WIO block portion 212B includes corresponding error register block 214B and test/ repair logic block 216B for facilitating I/O operations (via I/O signals 222B) and test/repair functionality with respect to the main array portion 204B.

Continuing to refer to FIG. 2, a memory control block, referred to as CENTER 215, is associated with XDEC 206 for generating various control and clock signals with respect to memory access, testing and repair. In accordance with the teachings of the present invention, a test/repair logic block 216C including a current error (CURERR) register 218 is also integrated therewith, whose structure and functionality will be set forth below in further detail with respect to fault detection and repair.

As alluded to hereinabove, the cross-referenced U.S. patent application entitled "System And Method For Testing A Memory," explains in detail how the logic circuitry associated with an integrated TRL wrapper operates in conjunction with a BISTR processor such as, e.g., BISTR processor 205, for testing a memory instance. Upon completion of testing, any failure data (e.g., address information associated with one or more faulty columns of the memory instance 202) is captured in the error register blocks 214A, 214B that is read out by the BISTR processor 205 as RSCOUT information. Further, as will be described in additional detail below, a CURERR signal 220 is generated towards the BISTR processor 205, which in turn activates repair logic circuitry embedded within the WIO blocks for repairing the faulty memory portion.

Figure 3:
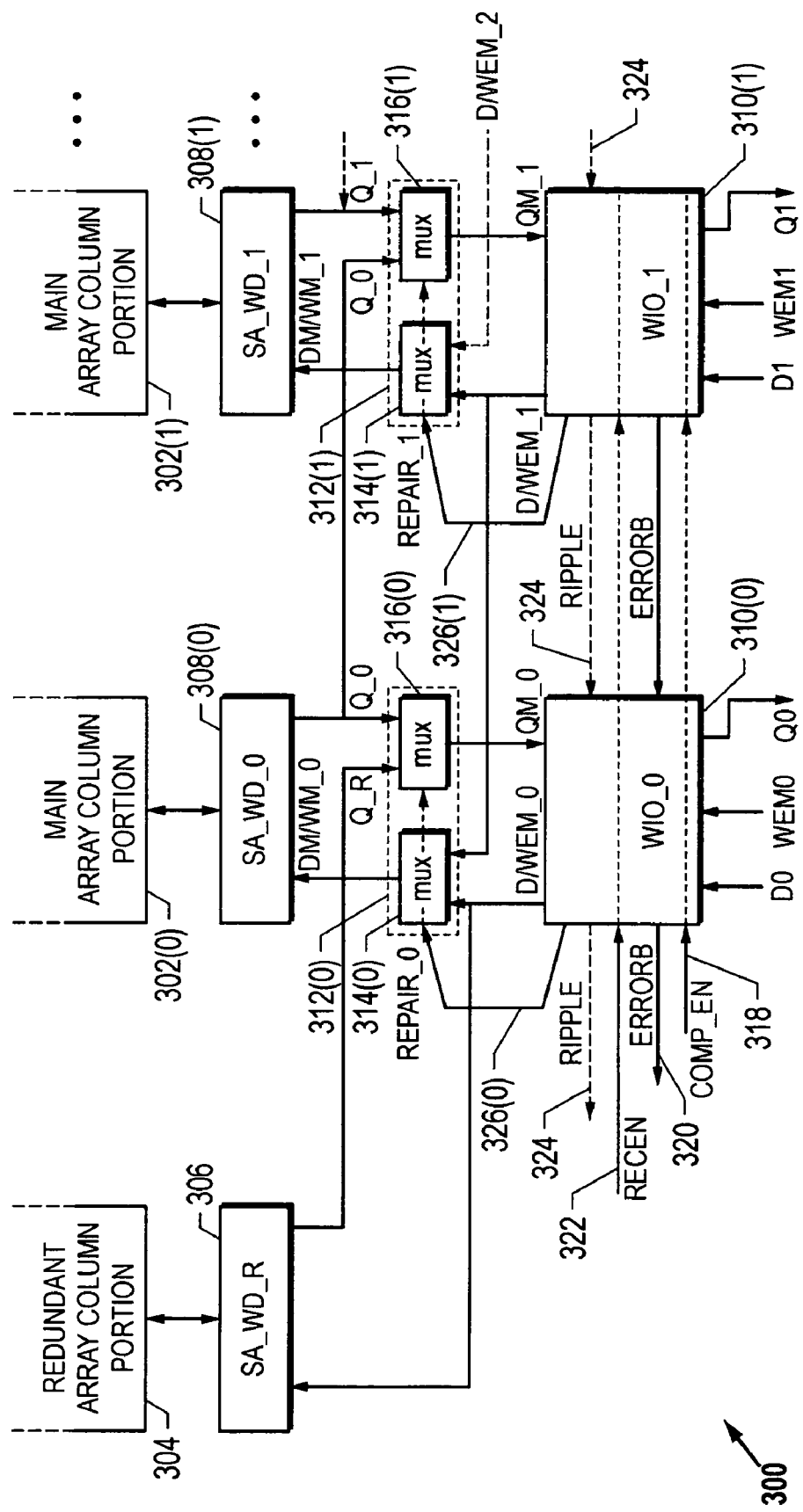
FIG. 3 depicts an exemplary embodiment of a memory instance portion having a wrapper I/O (WIO) layer as shown in FIG. 2 for effectuating repair.

FIG. 3 depicts an exemplary embodiment of a memory instance portion 300 that illustrates additional details of the present invention's memory fault detection scheme. Those skilled in the art should readily recognize that the memory instance portion 300, which may form a part of the memory instance 202 shown in FIG. 2, includes a plurality of main array column (MAC) portions, e.g., MAC portion 302(0) and MAC portion 302(1). By way of implementation, each MAC portion may include one or more memory columns, e.g., 4, 8, 16, and so on. A redundant array column (RAC) portion 304 (which may also include one or more redundant memory columns as may be needed for replacement of a MAC portion determined to be faulty) is provided as part of the memory instance portion 300, wherein each of the MAC portions and RAC portion is associated with a sense amplifier (sense amp or SA) and write driver (WD) block for effectuating memory access operations. Accordingly, reference numeral 306 refers to the sense amp and write driver (SA_WD) block associated with the RAC portion 304 and, likewise, reference numerals 308(0) and 308(1) refer to the SA_WD blocks corresponding to MAC portions 302(0) and 302(1), respectively.

In accordance with the teachings of the present invention, the SA_WD block of each MAC portion is coupled to a corresponding WIO via a multiplexer block that manages coupling relationships between the SA_WD block and the corresponding WIO based on whether the MAC portion is determined to be faulty or not. In normal default operation where there is no faulty MAC portion, each WIO interacts with its corresponding SA_WD block. As will be further explained hereinbelow, if an error is detected in a particular MAC portion, then each of the WIO blocks from that faulty MAC portion onward will shift its coupling relationship to the SA_WD block that is disposed to one side of the SA_WD block to which it is normally coupled. In other words, the WIO blocks, starting from the WIO of the faulty MAC portion, successively shift their coupling relationships to one side or the other of their default SA_WD blocks until the last WIO (i.e., the leftmost WIO or the rightmost WIO, depending on where the RAC portion is placed) becomes shifted to the SA_WD_R block of the RAC portion, thereby effectively replacing the faulty MAC portion.

As depicted in FIG. 3, WIO_0 310(0) can be coupled to SA_WD_0 308(0) of MAC portion 302(0) (normal coupling) or to SA_WD_R 306 of RAC portion 302(0) (repair scenario) via MUX block 312(0). Likewise, WIO_1 310(1) can be coupled to SA_WD_1 308(1) of MAC portion 302(1) under normal coupling or to SA_WD_0 308(0) of MAC portion 302(1) under a repair scenario, via MUX block 312(1).

In the illustrated embodiment of memory instance portion 300, three interfacing signals are provided between the WIO blocks and the SA_WD blocks: D (data), WEM (write control signal) and Q (data out). The MUX block layer disposed between the SA_WD layer and the WIO layer controls whether these signals operate in connection with the MAC portion that is normally coupled (i.e., when no faulty columns need to be repaired), or in connection with the MAC portion to the left or right of the normal-coupled MAC portion (when a faulty MAC portion is to be repaired). Accordingly, whereas each MUX block may include three separate MUXes, one each for the three signals, the illustrated embodiment is provided with only two MUXes in each of the MUX blocks for the sake of simplicity. For example, MUX 314(0) of the block 312(0) is operable to select between the respective D and WEM signals (i.e., between D_0 and D_1, or between WEM_0 and WEM_1) provided by two adjacent WIO blocks, WIO_0 and WIO_1, so as to forward the selected D or WEM signal towards SA_WD_0 308(0) as DM/WM_0. Likewise, MUX 314(1) of the block 312(1) can select between D/WEM_1 (provided by WIO_1) (under normal coupling conditions) and D/WEM_2 (provided by the neighboring WIO_2, not shown in this FIG.) (under repair conditions), for forwarding the selected D or WEM signal towards SA_WD_1 308(1) as DM/WM_1. In the opposite direction of the data flow associated with memory read operations, MUX 316(0) of the block 312(0) is operable to select between data (Q_R) provided by SA_WD_R 306 (associated with the RAC portion 304) (under repair conditions) and data (Q_0) provided by SA_WD_0 308(0) (under normal coupling conditions). In similar fashion, MUX 316(1) of the block 312(1) is operable to select between data (Q_0) provided by SA_WD_0 308(0) (associated with the MAC portion 302(0)) (under repair conditions) and data (Q_1) provided by SA_WD_1 308(1) (under normal coupling conditions).

Control signaling with respect to each of the various MUXes disposed as part of the MUX layer is effectuated by means of a REPAIR signal that is generated by the logic circuitry of the individual WIO blocks. As shown in FIG. 3, REPAIR_0 326(0) is generated by WIO_0 310(0) for controlling MUXes 314(0) and 316(0) and, similarly, REPAIR_1 326(1) is generated by WIO_1 310(1) for controlling MUXes 314(1) and 316(1). Fault detection, generation of the REPAIR signal upon fault detection with respect to a particular MAC portion, and the propagation of such detection in either direction of the MAC portion (depending on where the RAC portion is disposed) are controlled by various control signals such as RIPPLE signal 324, RECEN (Repair Enable) signal 322, ERRORB signal 320, and COMP_EN (Comparison Enable) signal 318, among others, that are described in additional detail hereinbelow.

Figure 4A:
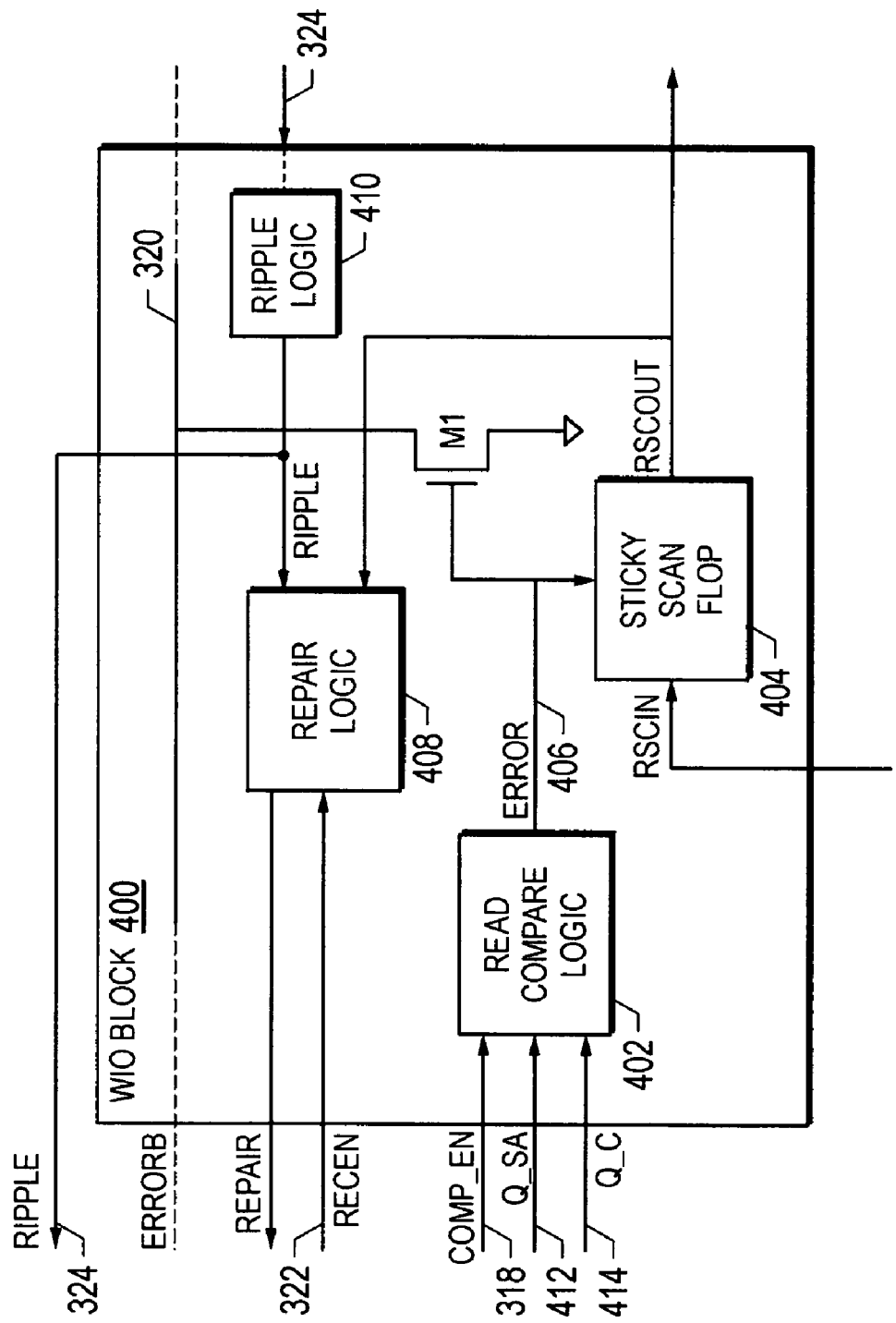
FIG. 4A depicts an exemplary embodiment of a WIO block.

FIG. 4A depicts an exemplary embodiment of a WIO block 400 that is operable in conjunction with a memory instance portion such as portion 300 described above with respect to a particular MAC portion. A read compare logic block 402 is provided for comparing a memory data output signal (Q_SA) 412 generated by the SA_WD block of the MAC portion and a data value to be compared (Q_C) 414, responsive to COM- P_EN 318 that may be provided upon completion of a memory test operation. If there is a mismatch between the data, an error output 406 of the read compare logic block 402 is operable to set the output (RSCOUT) of a "sticky" scan flop 404 such that RSCOUT=1, which operates as the error information corresponding to the MAC portion that has been tested. The error output 406 also pulls down a pull-down device M1 (which may be an N-channel field effect transistor in one exemplary embodiment) that is coupled to the ERRORB signal 320 in a wired-OR combination with the pull-down devices of other WIO blocks.

The RSCOUT signal, i.e., output of the sticky scan flop 404, is provided to a repair logic block 408 of the WIO block 400. A "RIPPLE" logic block 410 is operable to propagate the RIPPLE signal 324 provided by the upstream WIO block (which in turn may have propagated the signal from its upstream WIO blocks) as an input to the repair logic block 408. Based on RECEN 322, the repair logic block 408 generates the REPAIR signal which controls the MUX block associated with the particular MAC portion. Accordingly, in essence, if RSCOUT is set (because of the error signal 406) and provided RECEN 322 is asserted, the REPAIR signal bit is generated, which controls the coupling relationship between the WIO and SA_WD blocks. The RIPPLE signal 324 ensures that all REPAIR signals to one side or the other side of the faulty MAC portion get set to 1 such that WIOs successively shift their respective coupling relationships to the left or right as a consequence.

Figure 4B:
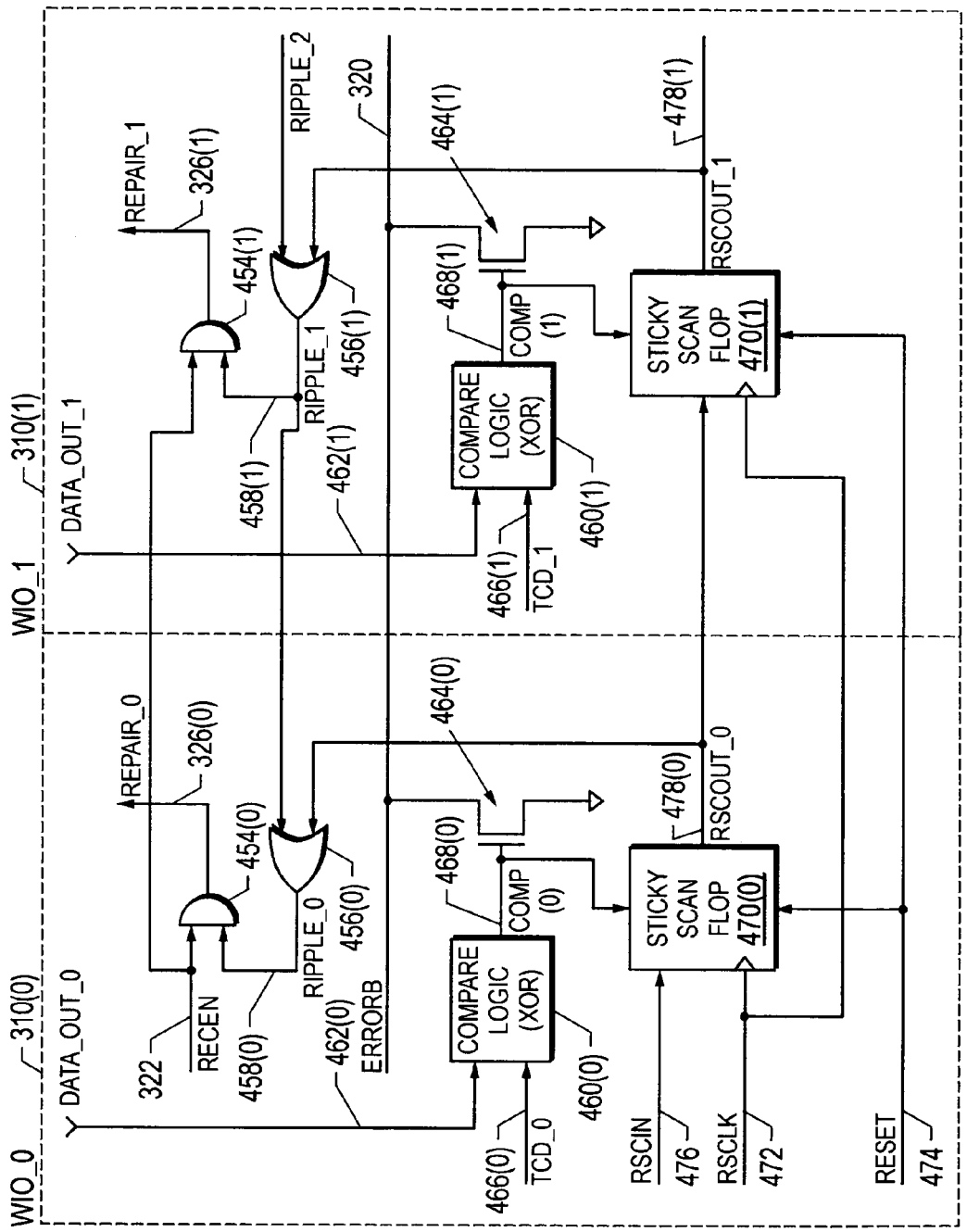
FIG. 4B depicts additional details of the exemplary WIO blocks shown in FIG. 3 with respect to REPAIR and RIPPLE signal generation according to one embodiment of the present invention.

FIG. 4B depicts additional details with respect to REPAIR and RIPPLE signal generation according to one embodiment of the present invention wherein WIO_0 310(0) and WIO_1 310(1), described hereinabove with respect to FIG. 3, are particularly exemplified. Data_Out_0 462(0) and Data_Out_1 462(1) are data outputs from the corresponding SA_WD blocks that are compared against Test Compare Data TCD_0 466(0) and TCD_1 466(1), respectively. An exclusive-OR (XOR)-based compare logic block 460(0) of WIO_0 generates a COMP(0) 468(0) signal when there is a mismatch between Data_Out_0 462(0) and TCD_0 466(0). Likewise, XOR-based compare logic block 460(1) of WIO_1 generates a COMP(1) 468(1) signal where there is a mismatch between Data_Out_1 462(1) and TCD_1 466(1). Reference numerals 464(0) and 464(1) refer to the two pull-down devices associated with the WIO blocks, respectively, which are coupled to ERRORB 320 in a wired-OR fashion. As explained above, sticky scan flops 470(0) and 470(1) are provided for storing appropriate error information (i.e., RSCOUT_0 478(0) and RSCOUT_1 478(1)) corresponding to the two MAC portions (not shown in this FIG.), based on the respective COMP signals generated by the XOR-based logic blocks. The sticky scan flop 470(0) of WIO_0 is operable responsive to RSCIN 476 and a scan clock, RSCLK 472. The output of the sticky scan flop 470(0), i.e., RSCOUT_0 478(0), is operable as an input to the sticky scan flop 470(1) of WIO_1, which is also controlled by RSCLK 472. Further, both sticky scan flop 470(0) and sticky scan flop 470(1) may be reset using a global RESET control signal 474, which resets RSCOUT_0 and RSCOUT_1 to 0.

Continuing to refer to FIG. 4B, the outputs of the sticky scan flops, i.e., RSCOUT_0 and RSCOUT_1, are provided to the respective RIPPLE and repair logic blocks of WIO_0 and WIO_1. Essentially, an upstream RIPPLE signal is propagated downstream via a wired-OR combination with the RSCOUT signals generated by the individual WIO blocks for effectuating the REPAIR signal generation. By way of implementation, an OR gate 456(0) of WIO_0 310(0) is operable responsive to RSCOUT_0 478(0) and RIPPLE_1 458(1) generated by the upstream WIO, i.e., WIO_1 310(1). Similarly, RSCOUT_1 478(1) and RIPPLE_2 drive the OR gate 456(1) of WIO_1 310(1). Each RIPPLE signal is in turn ANDed with RECEN 322 for generating the REPAIR signal specific to the corresponding MAC portion. Reference numeral 454(0) refers to an AND gate driven by RIPPLE_0 458(0) and RECEN 322 for generating REPAIR_0 326(0). Likewise, AND gate 454(1) is operable responsive to RIPPLE_1 458(1) and RECEN 322 for generating REPAIR_1 326(1).

Figure 4C:
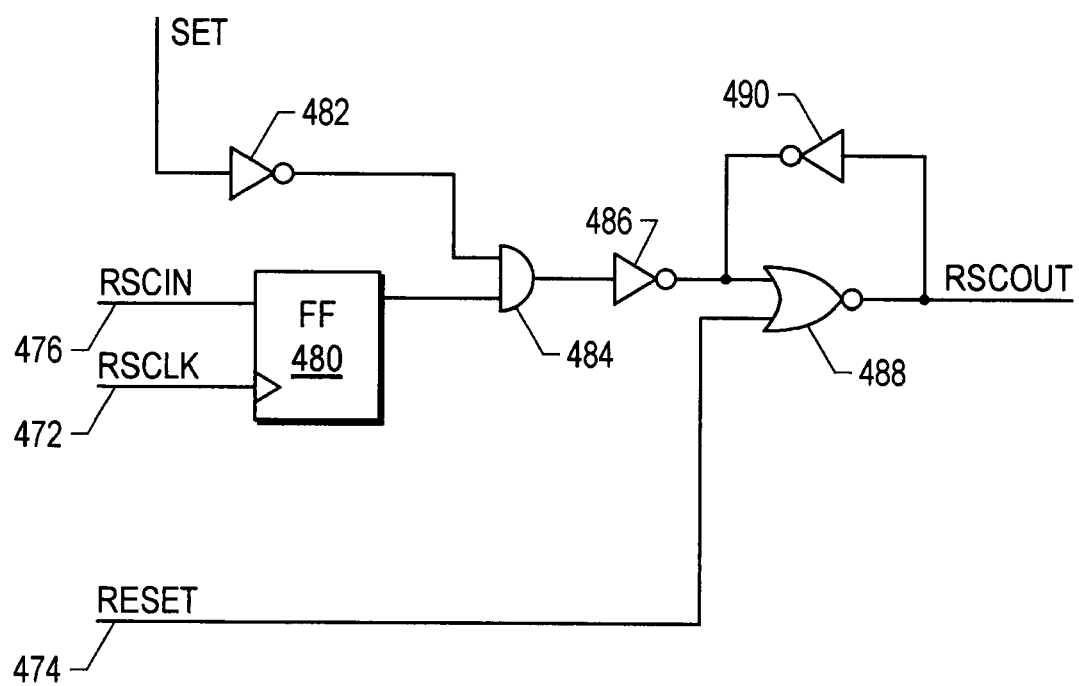
FIG. 4C depicts an exemplary embodiment of a sticky scan flop for use with a WIO in accordance with the teachings of the present invention.

FIG. 4C depicts an exemplary embodiment of a sticky scan flop for use with a WIO in accordance with the teachings of the present invention. A SET signal 483, which is operable as a error/comparison signal described above, is operable to set the output of the sticky scan flop, i.e., RSCOUT, to 1, provided RESET 474 is not active. The SET signal 483 is first inverted by an inverter 482 whose output is provided to an AND gate 484 whose second input is coupled to a conventional flip-flop (FF) 480. FF 480 is operable to generate an output responsive to RSCIN 476 (or, RSCOUT from a neighboring WIO, as the case may be) and RSCLK 472, which output is then ANDed with the output of inverter 482 using AND 484. The output of AND 484 is inverted by inverter 486 that drives a NOR gate 488 whose other input is coupled to RESET 474. The output of the NOR gate 488 is operable as RSCOUT, which is fed back as an input to the NOR gate 488 via inverter 490. Accordingly, RESET 474 has the priority to set RSCOUT to 0. Thus, if RESET is disabled (i.e., RESET=0), then when SET=1 (because of the error/comparison signal generated by the data compare logic), RSCOUT is driven to 1. It should be seen that RSCOUT remains unchanged unless reset by the RESET signal 474 or when the scan data gets scanned in at the positive edge of RSCLK 472.

Figure 5A:
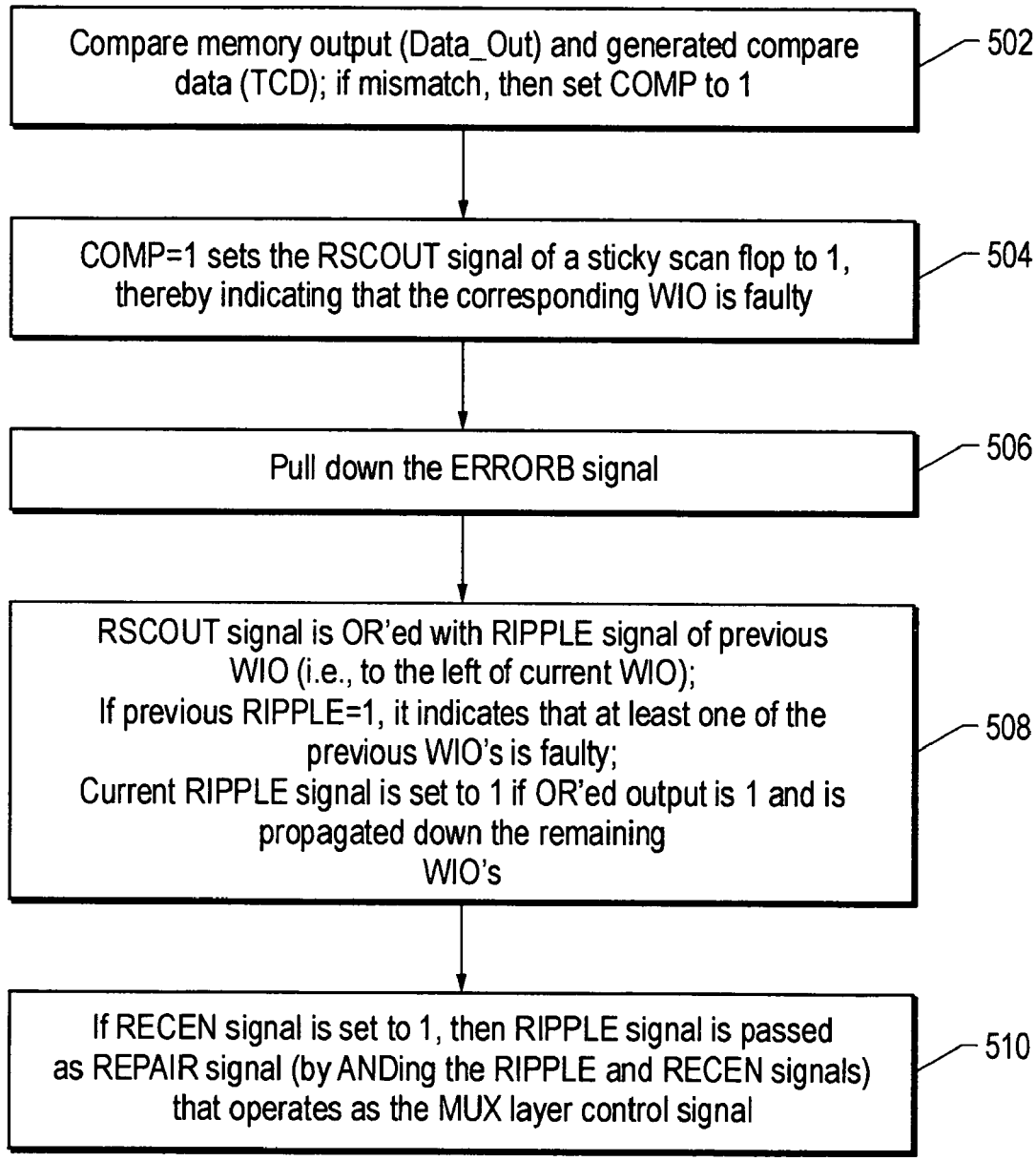
FIG. 5A is a flow chart that sets forth REPAIR and RIPPLE signal generation according to one embodiment of the present invention.

FIG. 5A is a flow chart that sets forth fault detection, repair, and error signal propagation according to one embodiment of the present invention. At block 502, data output (Data_Out) of a memory instance is compared with a generated TCD value. A fault is detected if there is mismatch, which then sets a COMP signal to 1. When COMP=1, the RSCOUT signal of the corresponding WIO's sticky scan flop is set to 1, thereby indicating that the memory portion with which it is associated is faulty (block 504). A wired-OR ERRORB signal is then pulled down due to the COMP signal (block 506) for capturing the error indication into a current register, which will be described below in further detail. The RSCOUT signal is ORed with the RIPPLE signal propagated from the neighboring WIO (e.g., to the left of the current WIO), and if the propagated RIPPLE=1, it is indicative of at least one of the previous I/O columns is faulty. The current RIPPLE signal is set to 1 if the ORed output is 1, which then is propagated downstream to the next WIO. These operations are consolidated at block 508. If RECEN signal=1, then the RIPPLE signal is passed as the REPAIR signal (by ANDing the RIPPLE and RECEN signals), which operates as the MUX control signal for controlling the interface between the WIO and the SA_WD layer of the memory instance (block 510).

Figure 5B:
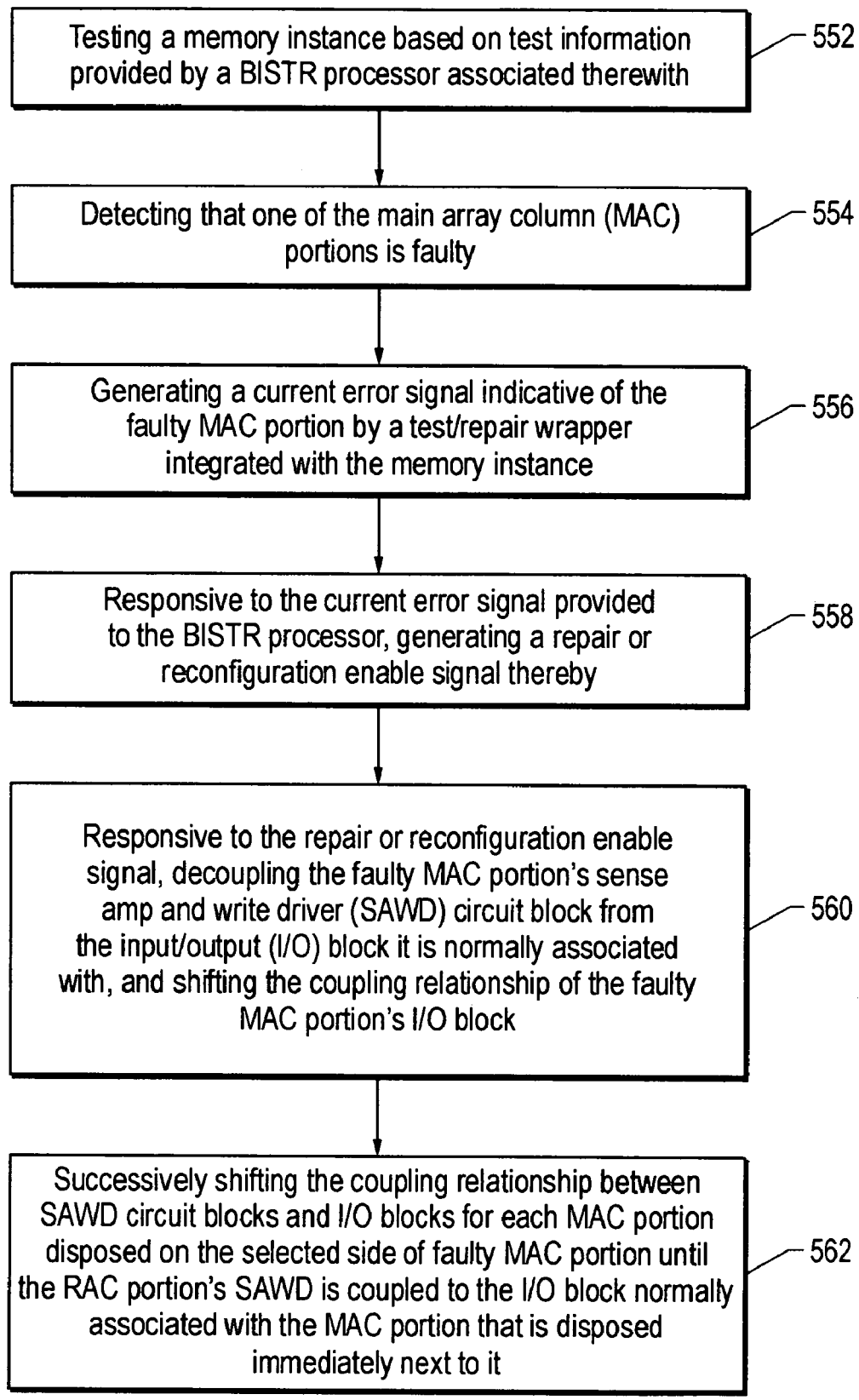
FIG. 5B is a flow chart that sets forth a memory repair method according to one embodiment of the present invention.

FIG. 5B is a flow chart that sets forth a memory repair method according to one embodiment of the present invention. A memory instance having an integrated TRL wrapper is tested based on test information provided by a BISTR processor associated therewith (block 552). Responsive thereto, upon detecting that one of the MAC portions of the memory instance is faulty (block 554), a current error signal is generated by the logic circuitry of the integrated TRL wrapper, the error signal being indicative of the faulty MAC portion (block 556). Responsive to the current error signal provided to the BISTR processor, a repair or reconfiguration enable signal is thereby generated (block 558). Subsequently, responsive to the repair enable signal, the faulty MAC portion's sense amp/ write driver (SAWD) circuitry is decoupled from the I/O block with which it is normally associated, which I/O block's coupling relationship is then shifted to a SAWD block normally associated with a MAC portion that is immediately next to the faulty MAC portion, disposed on one side thereof (block 560). Thereafter, the coupling relationships between the SAWD circuit blocks and I/O blocks are successively shifted for each MAC portion disposed on the selected one side of the faulty MAC portion until the coupling relationship of the I/O block normally associated with the MAC portion that is disposed immediately next to the RAC portion is shifted to the SAWD block of the RAC portion (block 562).

Figure 6A:
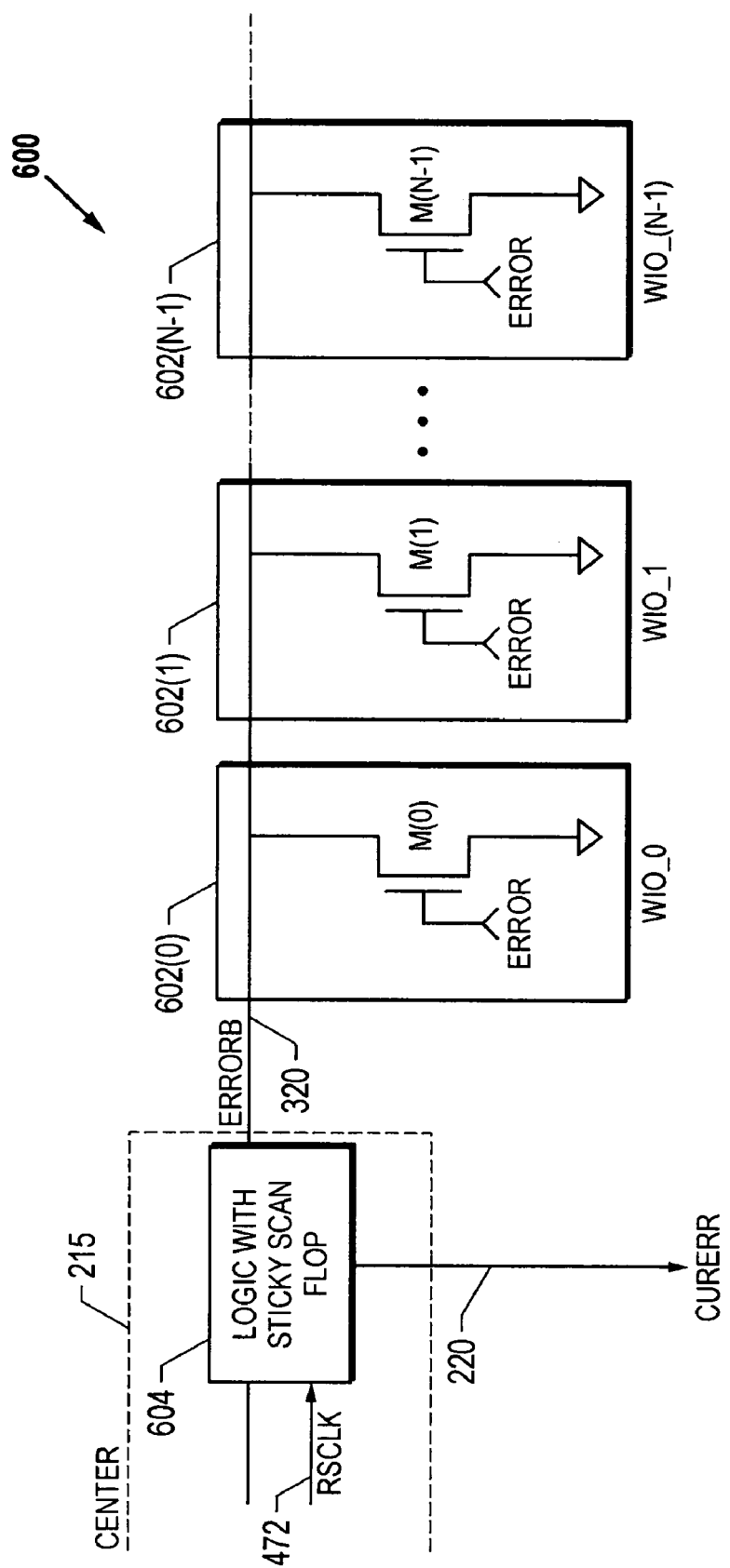
FIG. 6A depicts an arrangement for generating an error (CURERR) signal that is used internally for repair control.

FIG. 6A depicts an arrangement for generating the CURERR signal 220 that is used internally for repair control. Reference numerals 602(0) through 602(N−1) refer to a plurality of WIO blocks disposed as part of a memory instance. Each WIO block includes the logic circuitry described in detail hereinabove, which operates to generate a WIO-specific error signal based on read comparison. As pointed earlier, the error signals from the WIO blocks are coupled together in a wired-OR combination (as ERRORB 320) via respective pull-down devices so as to be able to drive the wired-OR ERRORB signal 320 LOW upon detection of a faulty MAC portion. A logic block and sticky flop combination 604 disposed in the memory instance's CENTER block 215 is operable to generate the CURERR signal 220 based on the ERRORB signal 320, which is provided internally to the BISTR processor for generating repair enable control signals, thereby eliminating the need for external post-processing.

Figure 6B:
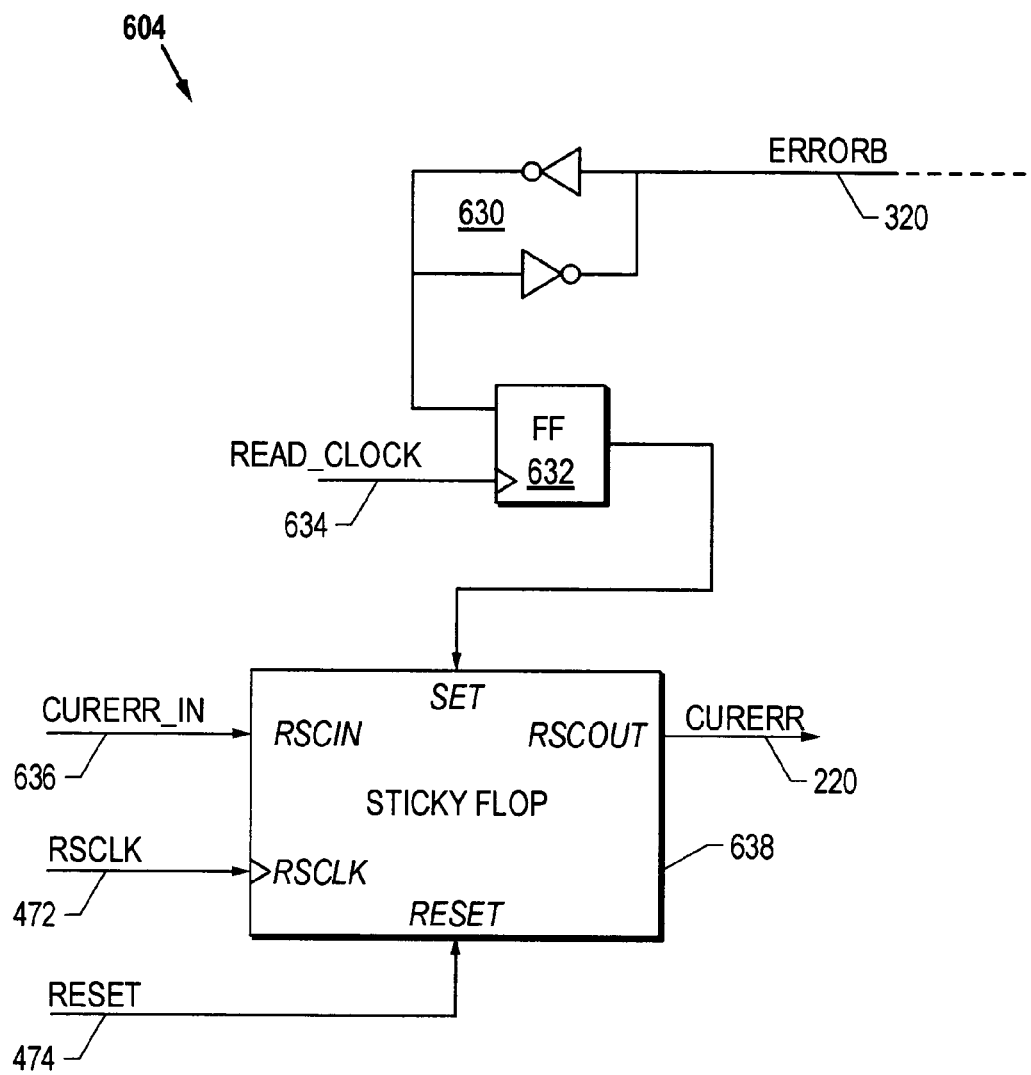
FIG. 6B depicts an embodiment of the logic circuitry associated with the arrangement shown in FIG. 6A.

FIG. 6B depicts an embodiment of the logic block and sticky flop combination 604 associated with the arrangement shown in FIG. 6A. The ERRORB signal 320 is provided to a cross-coupled inverter arrangement 630 whose output is forwarded to a conventional FF 632. A READ_CLOCK 634 is operable as the clock signal with respect to FF 632, the output of which is coupled to the SET port of a sticky flop 638. It should be appreciated that the sticky flop 638 may be comprised of such logic circuitry as shown in FIG. 4C, described in detail hereinabove. The RSCIN, RSCLK and RESET ports of the sticky flop are driven by CURERR_IN 636, RSCLK 472 and RESET 474, for outputting CURERR 220 from the RSCOUT port. As pointed before, when there is a data mismatch detected by the read comparison logic circuitry of a WIO, the ERRORB signal 320 gets pulled down, which is then inverted by the cross-coupled inverter arrangement 630 for driving FF 632. At the positive edge of the READ_CLOCK signal 634, the output of FF 632 is flopped which is forwarded to the SET port of the sticky flop 638 for setting it to 1. Accordingly, CURERR 220 is driven to 1, which will remain unchanged unless reset by RESET 474, or getting scanned in as CURERR_IN 636 at the positive edge of RSCLK 472.

FIGS. 7A-7D depict a 4-WIO memory instance where a faulty memory block or portion may be repaired in accordance with an embodiment of the present invention. In each of these FIGURES, reference numerals 704A-704D refer to the four MAC portions, each having a corresponding SAWD block (reference numerals 708A through 708D) and WIO block (reference numerals 710A through 710D). Also included in the 4-WIO memory instance is RAC portion 702 along with the associated SAWD block 706 that is disposed to the left of the MAC portions for repairing a faulty MAC portion, should the need arise.

Figure 7A:
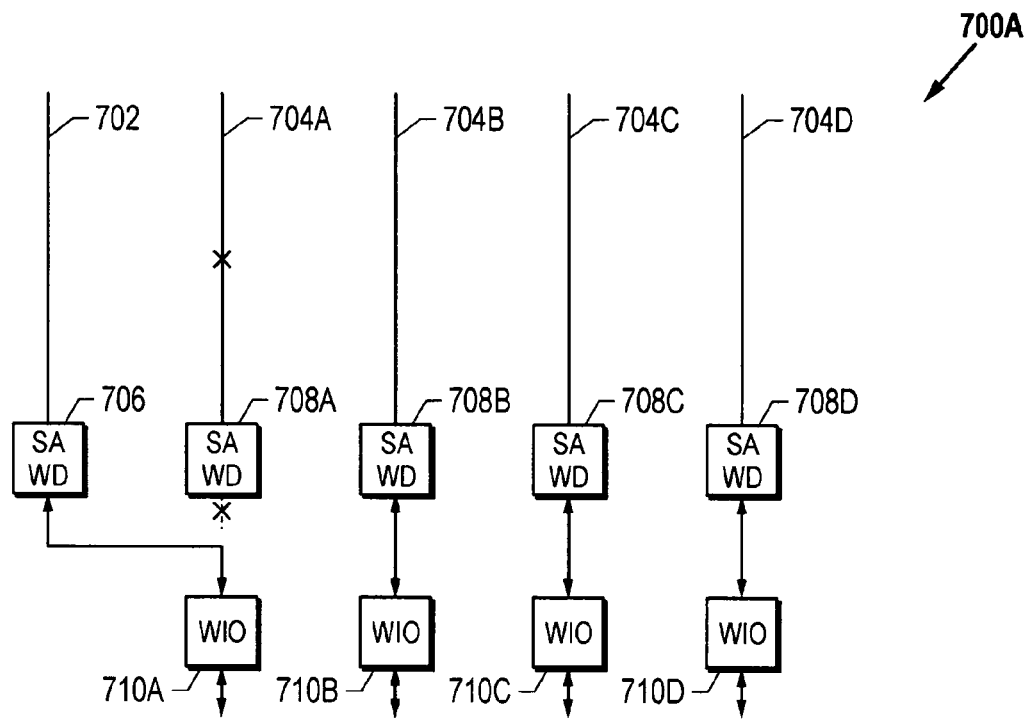
FIGS. 7A-7D depict a 4-WIO memory instance where a faulty memory block may be repaired in accordance with an embodiment of the present invention.
Figure 7B:
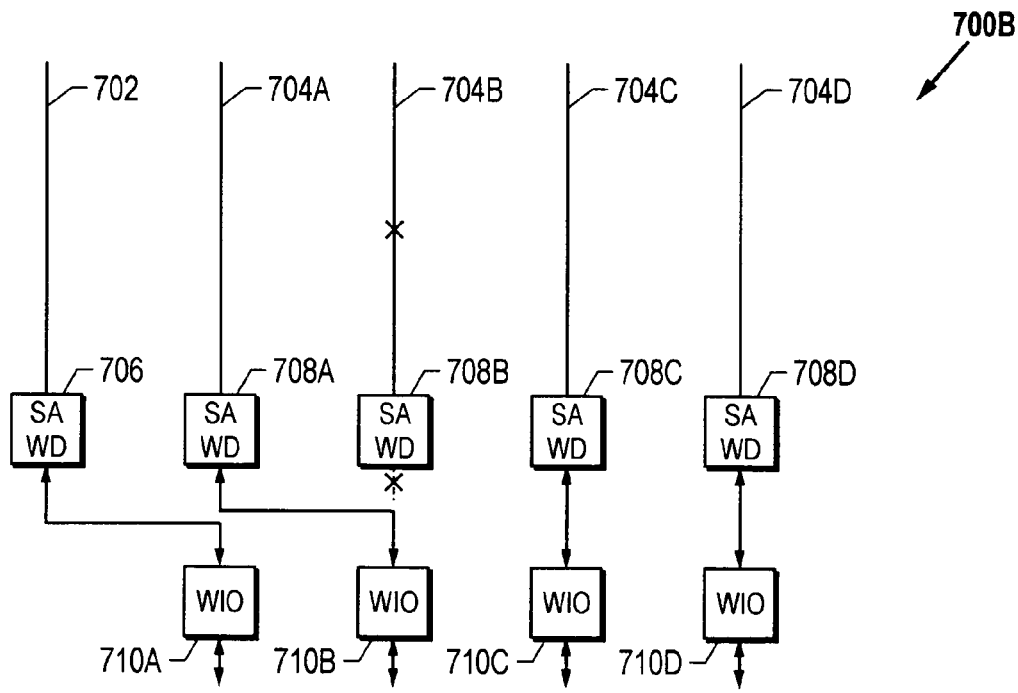
Figure 7C:
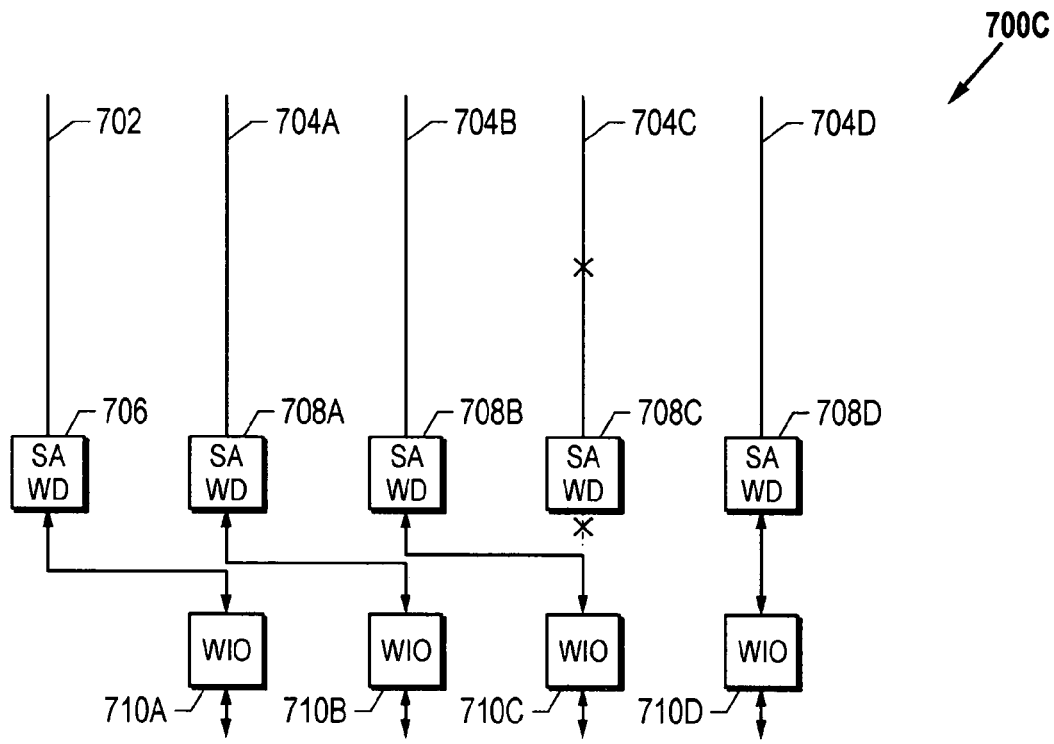
Figure 7D:
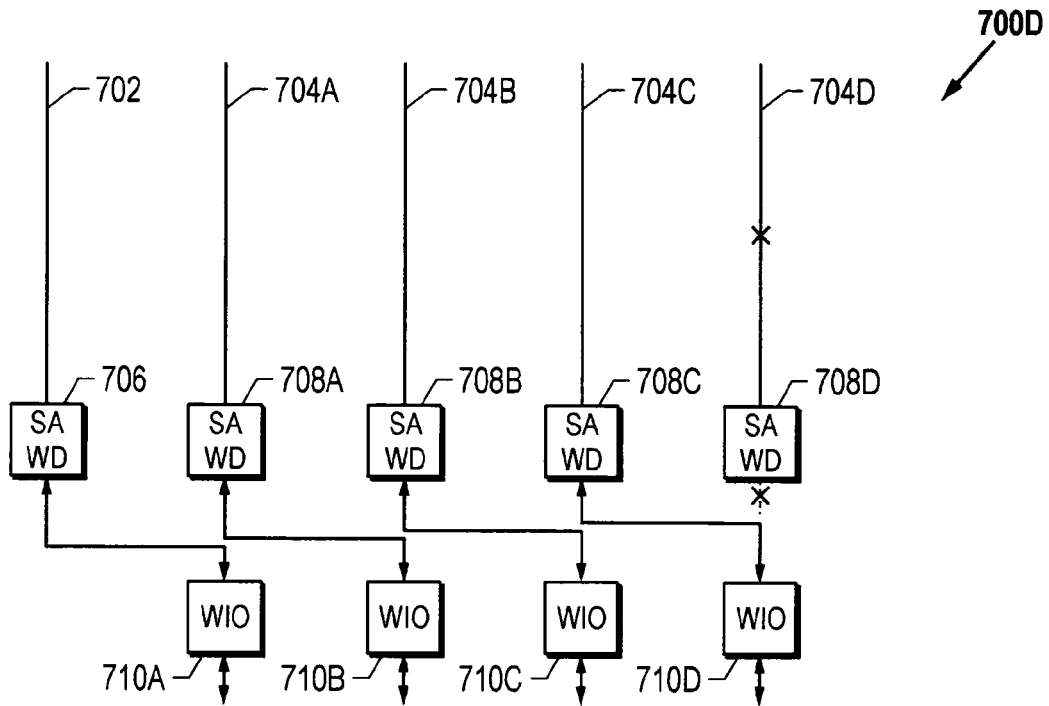

In particular, reference numeral 700A of FIG. 7A illustrates the scenario where the MAC portion 704A is detected to be faulty. Accordingly, the coupling relationship between SAWD 708A and WIO 710A normally associated with this MAC portion 704A is decoupled responsive to a REPAIR signal generated by WIO 710A (under control of RECEN), whereby WIO 710A is shifted to its left neighbor's SAWD, in this case, SAWD 706 of the RAC portion 702. The coupling relationships of the remaining MAC portions remain unchanged, however.

Similarly, reference numerals 700B through 700D illustrate the scenarios where the MAC portions 704B, 704C, and 704D are respectively detected be faulty. In each case, the faulty MAC portion's WIO/SAWD coupling relationship is decoupled such that the WIO's coupling is shifted to its left neighbor's SAWD, and the WIOs left of the faulty MAC portion successively shift their respective coupling relationships until the SAWD of the RAC portion 702 is coupled to its immediate neighbor's WIO, i.e., WIO 710A.

Based on the foregoing, it should be appreciated that the present invention provides a simple yet efficient and elegant memory repair scheme whereby the repair intelligence is integrated into the memory such that the various deficiencies and shortcomings of the current repair solutions are advantageously overcome.

Because the location information of a faulty memory portion is immediately available to the integrated TRL logic, the memory instance (e.g., a compilable memory instance) can be repaired without having to resort to time-consuming external post-processing for generating a repair bit signature. Not only is the repair cycle time reduced significantly, but it is also quite convenient for the user to repair the memory right away once the faulty location is determined.

It is believed that the operation and construction of the present invention will be apparent from the foregoing Detailed Description. While some aspects of the method and circuitry shown and described may have been characterized as being preferred, it should be readily understood that various changes and modifications could be made therein without departing from the scope of the present invention as set forth in the following claims.

What is claimed is:

1. A method of repairing a memory instance having a plurality (N) of main array column (MAC) portions and a redundancy array column (RAC) portion, wherein each of said MAC portions and said RAC portion is associated with a sense amplifier and write driver (SAWD) circuit block for operably coupling with one of N input/output (I/O) blocks provided for said memory instance, comprising:

detecting that one of said MAC portions is faulty;

decoupling said faulty MAC portion's SAWD circuit block from an I/O block associated therewith and shifting said faulty MAC portion's I/O block to a SAWD circuit block associated with a MAC portion immediately next to said faulty MAC portion on a selected side thereof; and successively shifting coupling relationships between SAWD circuit blocks and I/O blocks for each MAC portion disposed on said selected side of said faulty MAC portion until an I/O block associated with a MAC portion that is immediately next to said RAC portion is shifted to said RAC portion's SAWD circuit block.

2. The method of repairing a memory instance as set forth in claim 1, wherein said operation of detecting that one of said MAC portions is faulty is performed responsive to test information provided by a built-in self-test and repair (BISTR) processor associated with said memory instance.

3. The method of repairing a memory instance as set forth in claim 2, wherein said test information is scanned into a test and repair logic wrapper integrated with said memory instance for performing testing operations with respect to said memory instance.

4. The method of repairing a memory instance as set forth in claim 3, wherein a current error signal is generated by said test and repair logic wrapper responsive to said detecting operation.

5. The method of repairing a memory instance as set forth in claim 4, wherein a repair enable signal is generated by said BISTR processor responsive to said current error signal, said repair enable signal operating to control said decoupling and shifting operations with respect to said faulty MAC portion's I/O circuit block.

6. The method of repairing a memory instance as set forth in claim 4, wherein said operation of successively shifting said coupling relationships between SAWD circuit blocks and I/O blocks is mediated by a RIPPLE control signal generated upon detecting that one of said MAC portions is faulty.

7. The method of repairing a memory instance as set forth in claim 1, wherein each I/O block is operatively connected to a SAWD circuit block through a respective multiplexer block.

8. A system for repairing a memory instance having a plurality (N) of main array column (MAC) portions and a redundancy array column (RAC) portion, wherein each of said MAC portions and said RAC portion is associated with a sense amplifier and write driver (SAWD) circuit block for operably coupling with one of N input/output (I/O) blocks provided for said memory instance, comprising:
   circuitry for detecting that one of said MAC portions is faulty;
   circuitry for decoupling said faulty MAC portion's SAWD circuit block from an I/O block associated therewith and for shifting said faulty MAC portion's I/O block to a SAWD circuit block associated with a MAC portion immediately next to said faulty MAC portion on a selected side thereof; and
   circuitry for successively shifting coupling relationships between SAWD circuit blocks and I/O blocks for each MAC portion disposed on said selected side of said faulty MAC portion until an I/O block associated with a MAC portion that is immediately next to said RAC portion is shifted to said RAC portion's SAWD circuit block.

9. The system for repairing a memory instance as set forth in claim 8, wherein said circuitry for decoupling and shifting said faulty MAC portion's I/O block is comprised of a multiplexer block operable responsive to a REPAIR signal.

10. The system for repairing a memory instance as set forth in claim 9, wherein said REPAIR signal is generated responsive to a repair enable signal provided by a built-in self-test and repair (BISTR) processor associated with said memory instance and a RIPPLE signal generated at least in part by said circuitry for successively shifting coupling relationships between said SAWD circuit blocks and I/O blocks for each MAC portion disposed on said selected one side of said faulty MAC portion.

11. The system for repairing a memory instance as set forth in claim 8, wherein said circuitry for detecting that one of said MAC portions is faulty comprises read compare logic operable to compare data output from said MAC portion with a test compare data value.

12. The system for repairing a memory instance as set forth in claim 11, wherein said test compare data value is provided by a test and repair wrapper integrated with said memory instance for performing testing operations with respect to said memory instance.

13. The system for repairing a memory instance as set forth in claim 11, wherein a current error signal is generated by said test and repair logic wrapper when one of said MAC portions is faulty.

14. The system for repairing a memory instance as set forth in claim 11, wherein said read compare logic comprises an exclusive-OR circuit.

* * * * *